United States Patent [19]
Lee et al.

[11] Patent Number: 5,858,577
[45] Date of Patent: *Jan. 12, 1999

[54] PHASE SHIFT MASK AND FABRICATION METHOD THEREOF

[75] Inventors: Jun-Seok Lee; Tae-Gak Kim, both of Seoul, Rep. of Korea

[73] Assignee: LG Semicon Co., Ltd., Choongcheongbuk-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 644,103

[22] Filed: May 10, 1996

[30] Foreign Application Priority Data

May 13, 1995 [KR] Rep. of Korea .................. 1995 11831

[51] Int. Cl.$^6$ ...................................................... G03F 9/00
[52] U.S. Cl. ...................................................... 430/5
[58] Field of Search ...................................... 430/5

[56] References Cited

U.S. PATENT DOCUMENTS

| | | | |
|---|---|---|---|
| 4,373,018 | 2/1983 | Reishmanis et al. | 430/312 |
| 4,494,997 | 1/1985 | Lemnios et al. | 148/1.5 |
| 5,006,285 | 4/1991 | Thackara et al. | 264/1.3 |
| 5,194,345 | 3/1993 | Rolfson | 430/5 |
| 5,194,346 | 3/1993 | Rolfson et al. | 430/5 |
| 5,260,152 | 11/1993 | Shimizu et al. | 430/5 |
| 5,285,517 | 2/1994 | Wu | 385/142 |
| 5,322,749 | 6/1994 | Han | 430/5 |
| 5,409,789 | 4/1995 | Ito | 430/5 |
| 5,478,679 | 12/1995 | Loong et al. | 430/5 |
| 5,536,604 | 7/1996 | Ito | 430/5 |
| 5,547,787 | 8/1996 | Ito et al. | 430/5 |
| 5,567,550 | 10/1996 | Smayling | 430/5 |
| 5,597,666 | 1/1997 | Kim | 430/5 |
| 5,620,815 | 4/1997 | Ito et al. | 430/5 |

*Primary Examiner*—Nam Nguyen
*Assistant Examiner*—Steven H. Ver Steeg
*Attorney, Agent, or Firm*—Morgan, Lewis & Bockius LLP

[57] ABSTRACT

A phase shift mask comprises a light transmitting substrate; a light shelding layer comprising an inorganic material formed on the light transmitting substrate; and a phase transition layer formed on the light shielding layer.

15 Claims, 6 Drawing Sheets

PHASE SHIFT MASK AND FABRICATION METHOD THEREOF

BACKGROUND OF THE INVENTION

1. Field of the Invention

The present invention relates to a phase shift mask and a fabricating method thereof.

2. Description of the Related Art

As the need for thin and compact size semiconductor devices increases, semiconductor devices having larger capacities have been widely studied. To improve the resolution of such devices, various photolithography processes are intensely studied, especially those involving mask processes. Among these mask processes, phase shift mask fabricating technology, which is capable of patterning a device using a phase transition effect to achieve a high resolution, draws much attention from the public and industry. Among the phase shift mask types used in phase shift mask fabrication, the alternating type, the rim type, and the attenuating type are well known in the industry. In each of these types, a pattern of a phase transition layer can be formed beside the pattern of a light shielding layer. This is in contrast to other types of phase shift masks that use a pattern of light shielding layer formed on the light transmitting substrate.

The phase shift mask is directed to provide an additional pattern of a phase transition layer on a substrate, whose pattern has a phase difference angle of 180° with respect to the phase of light passing through a substrate having another, better light transmitting characteristic. The light transmitting rate of a phase transition layer is present in various ranges. In addition, the phase shift masks of an alternating type and of a rim type (but not of an attenuating type) have an appropriately arranged light transmitting region and phase transition layer at the boundary of the light shielding layer.

The alternating type phase shift mask has a light transmitting region and a phase transition layer which are alternatingly arranged to the light shielding layer, and some patterns are additionally formed at the time of fabricating a device, so that the light intensity is increased. The rim type phase shift mask is basically directed to form a pattern of a phase transition layer, having relatively greater width than that of the pattern of the light shielding layer, on the pattern of the light shielding layer. The attenuating type phase shift mask is directed to use a light transmitting layer which does not include a light shielding layer and a layer of a phase transition having a relatively low light transmitting rate. Moreover, it is directed to use entire regions, except the light transmitting region as a phase transition layer.

The above described phase shift masks are difficult to use in the industry because there are many problems in the fabrication and maintenance process of a reticle, such as a pollution of a substrate caused during the fabrication of a semiconductor device, and in the design and test of the reticle. It is particularly difficult to use a rim type phase shift mask in the industry.

As shown in FIG. 1A, a phase shift mask according to the conventional art includes a light shielding layer 2 of chrome formed on a light transmitting substrate 1, a phase transition layer 3 formed on the light shielding layer 2, and a light transmitting poly-methyl-methacrylate ("PMMA") formed on the phase transition layer 3 with a thickness T. Thereafter, a photosensitive film 4 is formed on the phase transition layer 3, and the phase transition layer 3 of the region not masked by the photosensitive film 4 is removed so that a pattern of the phase transition layer 3 is exposed.

As shown in FIG. 1B, after the photosensitive film 4 is removed, the light transmitting layer 2 not masked by the pattern of the phase transition layer 3 is etched by a wet-type etching method. At this time, because the light shielding layer 2 is undercut, the width of lower portion of the pattern of the light shielding layer 2 is smaller than that of the phase transition layer 3. Thus the substrate 1 is exposed by the width W from each edge of both sides of the phase transition layer 3. Therefore, the light consecutively passed through the above described edge portions of the phase transition layer 3 and the substrate 1 and the light passed through only the substrate 1 are shifted by the angle of 180° from each other.

A fabricating method of a conventional rim-type phase transition mask will now be explained.

First, as shown in FIG. 2A, a light shielding layer 12 of chrome is deposied on a light transmitting substrate 11. Thereafter, after a pattern of a photosensitive film 14 is formed on the light shielding layer 12, the light shielding layer 12 of the region unmasked by the pattern of the photosensitive film 14 is etched to expose the pattern of the light shielding layer 12 under the pattern of the photosensitive film 14.

As shown in FIG. 2B, a phase transition layer 15 of PMMA, which is a light transmitting photosensitive film, is coated on a region of the pattern of the light shielding layer 12 and the substrate 11. Thereafter, when light from a light exposing apparatus (not shown) is exposed to the rear side surface of the substrate 11, the region of the phase transition layer 15 of the pattern of the light shielding layer 12 is shielded from the light; however, the region of the phase transition layer 15 of the substrate 11 is exposed to the light.

As shown in FIG. 2C, the phase transition layer 15 is photoetched so that the region of the light shielding layer 12 has a pattern of the phase transition layer 15. At this time, the thickness T of the pattern of the phase transition layer 15 is such that it causes a phase shift.

As shown in FIG. 2D, the pattern of the light shielding layer 12 of the region not masked by the pattern of the phase transition layer 15 is etched by a wet-type etching method. At this time, the pattern of the light shielding layer 12 is undercut, and the width of the lower portion of the pattern of the light shielding layer 12 is smaller than that of the pattern of the phase transition layer 15, and each edge, having a width W, of both sides of the substrate of the pattern of the phase transition layer 15 is exposed. Therefore, light consecutively passed through the above described edge of the phase transition layer 15 and the substrate 11, in order, and light passed through only the substrate 11 are shifted by 180° from each other.

Because the conventional phase shift mask fabricating method is directed to each the region of the light shielding layer except the region of the pattern of the light shielding layer on the light transmitting substrate, the surface of the light transmitting substrate can be damaged. In addition, because the conventional phase shift mask fabricating method involves wet-etching the region of the light shielding layer not masked by the pattern of the phase transition layer and forming the pattern of the light shielding layer in which the lower portion of the pattern of the phase transition layer is undercut, it is difficult to provide a phase transition layer having a thickness and a width from each edge of both sides of the phase transition layer, such that a desired phase shift effect can not be obtained.

SUMMARY OF THE INVENTION

Accordingly, the present invention is directed to a phase shift mask and a fabricating method thereof that substantially obviate one or more of the problems due to limitations and disadvantages of the related art.

An object of the present invention is to provide an improved phase shift mask that advantageously includes a pattern of a light shielding layer, which can be an inorganic photosensitive film having a better light shielding property because silver (Ag) is doped on a light transmitting substrate, and that includes a pattern of a phase transition layer, which can be an organic photosensitive film, larger than the pattern of the light transmitting layer.

Additional features and advanges of the invention will be set forth in part in the description which follows and in part will be apparent from the description, or may be learned by practice of the invention. The objects and other advantages of the invention will be realized and attained by the structure particularly pointed out in the written description and claims thereof as well as he appended drawings.

To achieve these and other advantages and in accordance with the purpose of the invention, as embodied and broadly described, a phase shift mask of the present invention includes a light transmitting substrate; a light shielding layer comprising an inorganic material formed on the light transmitting substrate; and a phase transition layer formed on the light shielding layer.

In another aspect, a phase shift mask fabricating method includes steps of forming an inorganic photosensitive film on a light transmitting substate; selectively doping the inorganic photosensitive film; forming a phase transition layer on the inorganic photosensitive film; and removing the inorganic photosensitive film except where selectively doped.

It is understood that both the foregoing general description and the following detailed descripion are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
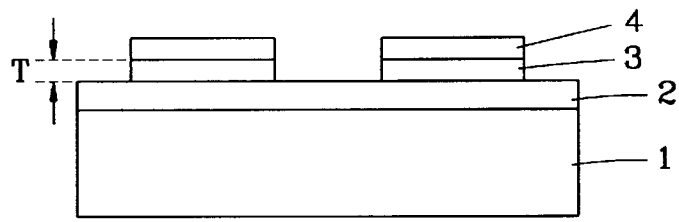
FIGS. 1A and 1B are cross-sectional views of a conventional phase shift mask during is fabricating process.
Figure 1B:
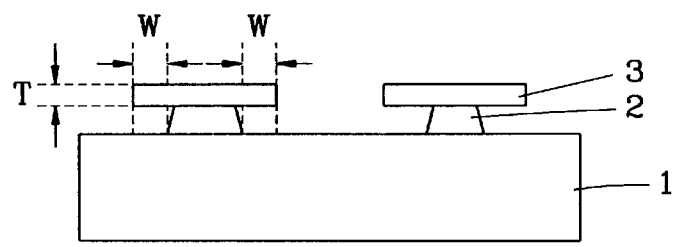
Figure 2A:
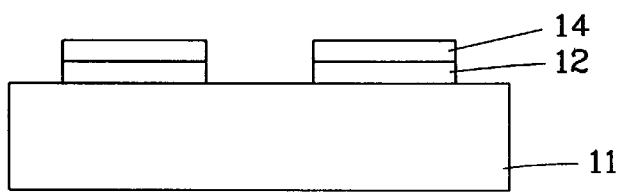
FIGS. 2A through 2D are cross-sectional views of another conventional phase shift mask during its fabricating process.
Figure 2B:
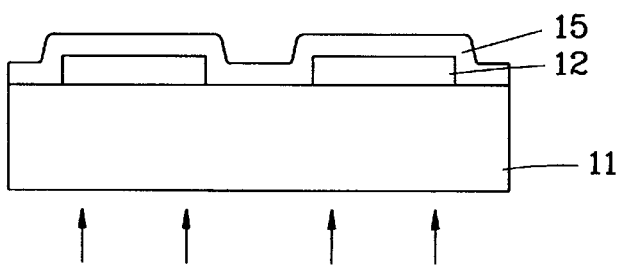
Figure 2C:
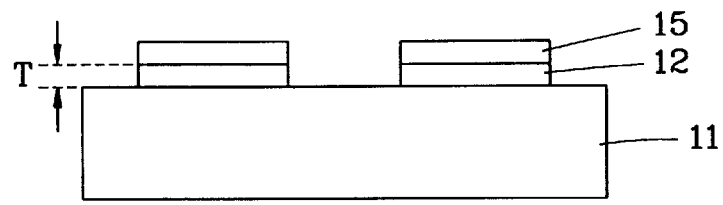
Figure 2D:
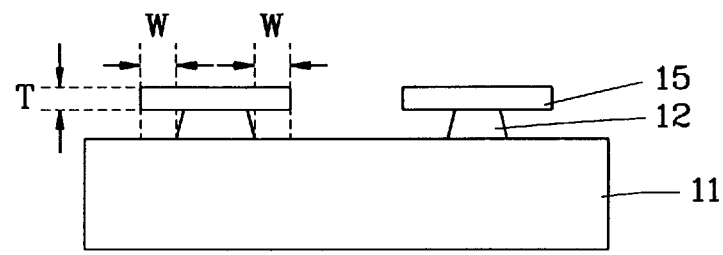
Figure 3:
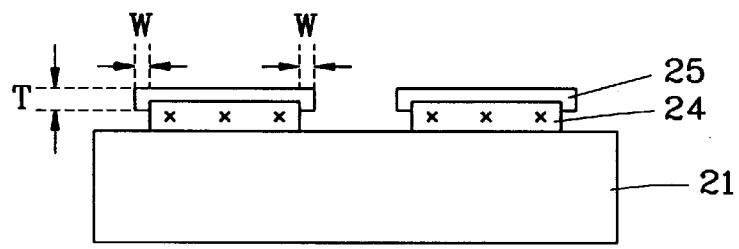
FIG. 3 is a cross-sectional view of a phase shift mask according to a first embodiment of the present invention during its fabricating process.

As shown in FIG. 3, a phase shift mask according to one embodiment includes a light transmitting subsrate 21, a pattern of a light shielding layer 24 of Ge—Se group inorganic photosensitive layer containing silver (Ag) formed on the light transmitting substrate 21, and a phase transition layer 25 of an organic photosensitive film formed on the light shielding layer 24 to be larger than that of the pattern of the light shielding layer 24. Here, since the width of the light shielding layer 24 is less than that of the phase transition layer 25, the edges of both sides of the substrate 21 are exposed by a width W. The light passed through the edges and the substrate 21 in order and the light passed through only the substrate 21 are shifted by an angle of 180°, and the pattern of the phase transition layer 25 has a thickness T.

A fabricating method of a phase shift mask according to the invention will now be explained.

Figure 4A:
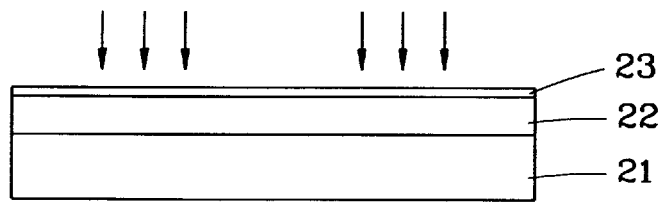
FIGS. 4A through 4E are additional cross-sectional views of the phase shift mask of FIG. 3 during its fabricating process.

As shown in FIG. 4A, a light transmitting inorganic photosensitive film 22 is formed on the light transmitting substrate 21 using a Plasma Enhanced Chemical Vapor Deposition (PECVD) method or a sputtering method. In this situation, a photosensitive film of $Ge_xSe_{1-x}$, where X is 0.1–0.3, is used. Preferably, a photosensitive film of $Ge_{0.1}Se_{0.9}$ having a thickness of 2000–6000 Å is used. Thereafer, the substrate 21, on which an inorganic light transmitting photosensitive film 22 is formed, is dipped into a liquid of $AgNO_3$, $AgCl$ or $KAg(CN)_2$, and a layer 23 of $Ag_2Se$ is formed on the photosensitive film 22 to have a thickness of 50–300 Å. In addition, the layer 23 of $Ag_2Se$ is partially exposed to an electronic beam outputted from a light exposing apparatus so as to form a desired region of the photosensitive film 22 as a light shielding layer. In this situation, instead of an electronic beam, an infrared ray or X-ray can be used.

Figure 4B:
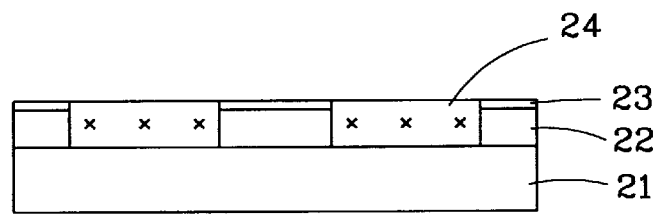

As shown in FIG. 4B, since silver (Ag) of the layer of $Ag_2Se$ of the exposed region is diffused into the photosensitive film 22 by a predetermined depth, the photosensitive film 22 of the region corresponding to the exposed region becomes an Ag-doped photosensitive film 24. Meanwhile, since silver is not diffused into the region of the photosensitive film 22 corresponding to the region unexposed to light, the photosensitive film 22 corresponding to the region unexposed to light remains unchanged.

Figure 4C:
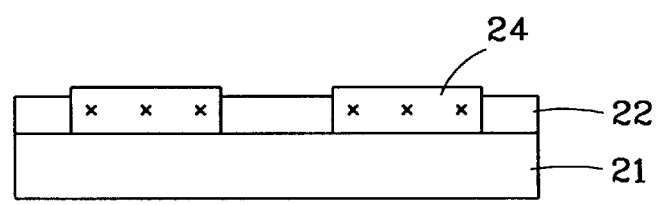
Figure 4D:
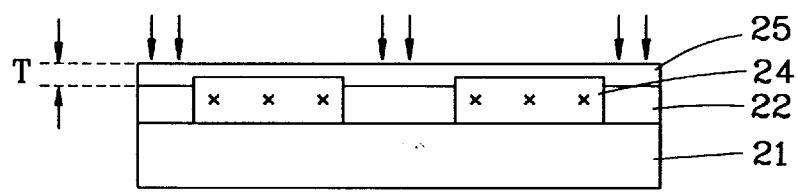

As shown in FIG. 4C, the layer 23 of $Ag_2Se$ corresponding to the region unexposed to light is removed by a liquid of $HNO_3$—HCL—$H_2O$. At this time, the thickness of the phase transition layer 25 on the pattern of the light shielding layer 24 is less than that of the phase transition layer 25 of the photosensitive film 22. In addition, the phase transition layer 25 of the photosensitive film 22 has thickness T which can cause a substantial phase shift. Thereafter, as shown in FIG. 4D, the phase transition layer 25 on the photosensitive film 22 is selectively exposed to light so as to form the phase transition layer 25 larger than that of the light shielding layer 24.

Figure 4E:
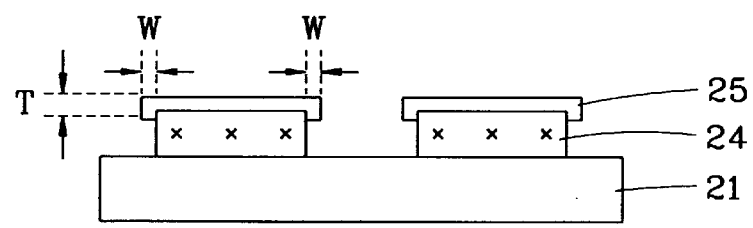

As shown in FIG. 4E, the phase transition layer 25 of the exposed layer is removed by an alkali developing solution, and the photosensitive film 22 is removed by the alkali developing solution. Here, since the etching selection ratio between the photosensitive film 22 and the light shielding layer 24 is 1:20, the light shielding layer 24 is vertically patterned. Therefore, since the width of the pattern of the phase transition layer 25 is greater than that of the pattern of the light shielding layer 24, the edges of both sides of the substrate are exposed to light by a width W.

The operation of a phase shift mask will now be explained with reference to FIGS. 5 to 7 and 8A and 8B.

Figure 5:
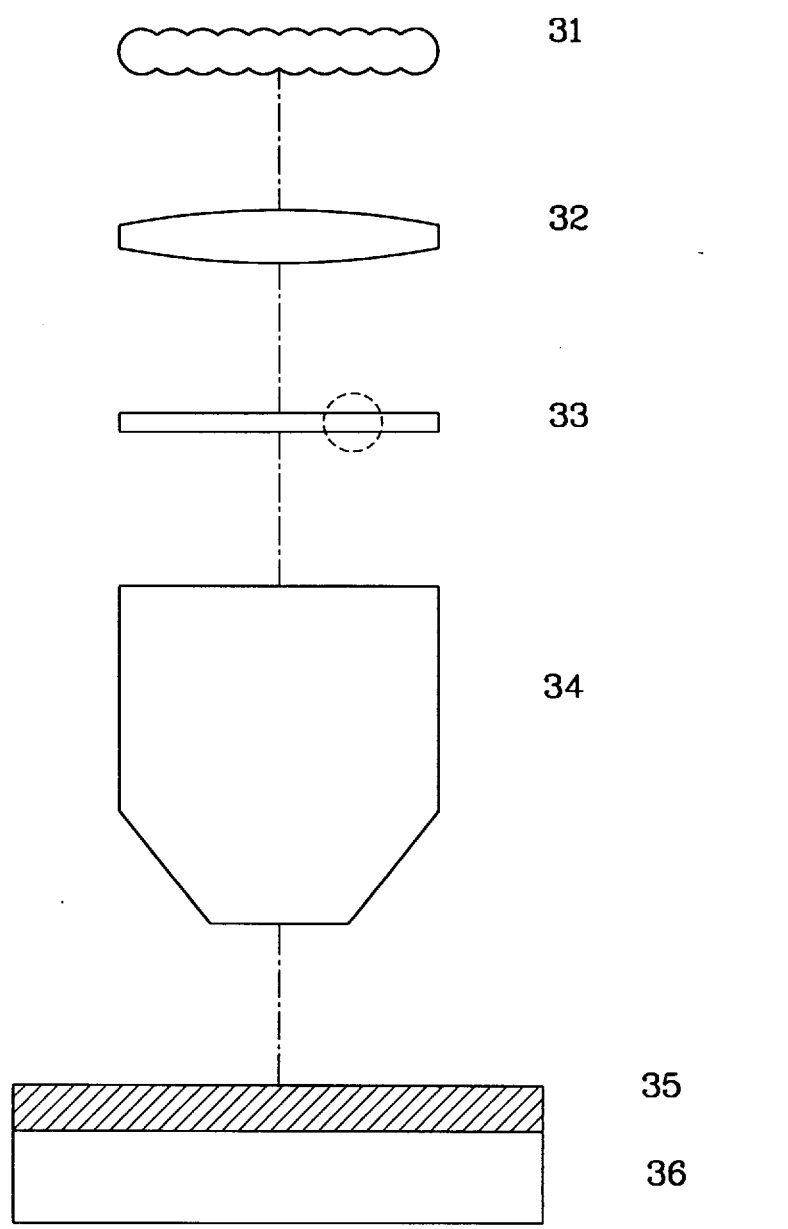
FIG. 5 is a schematic cross-sectional view of a light exposing apparatus adapted to the phase shift mask of FIG. 3.

Referring to FIG. 5, in a process of photolithography, a semiconductor substrate 36 coated with a photosensitive film 35 is exposed to a light emitted from a light source (not shown) through a lenticular lens 31, a condensing lens 32, a phase shift mask 33 and an attenuating lens 34, thus transferring patterns formed in the phase shift mask 33 to the photosensitive film 35.

Figure 6:
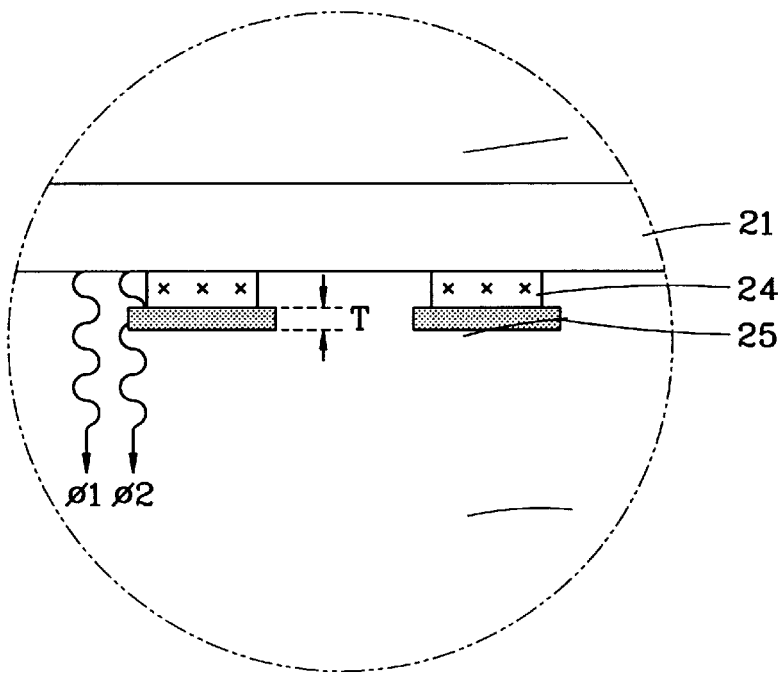
FIG. 6 is an enlarged cross-sectional view of the phase shift mask of FIG. 5.
Figure 7:
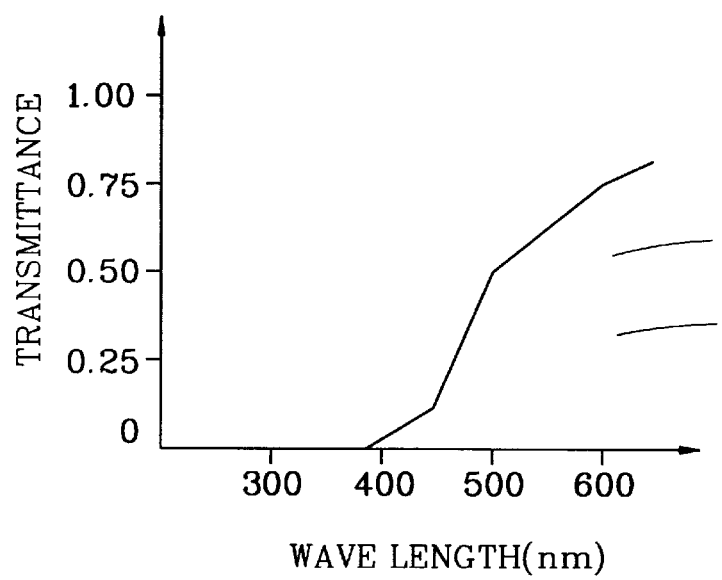
FIG. 7 is a graph of a relationship between a light transmittance of a light shielding layer and a wavelength of a light of FIG. 6.
Figure 8:
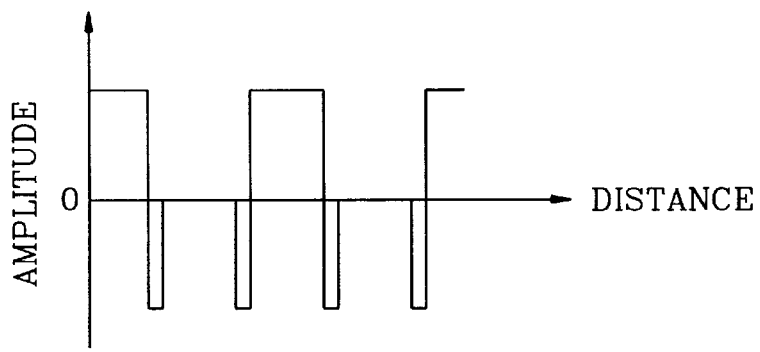
FIG. 8 is a graph of an amplitude of a light passed through a phase shift mask of FIG. 6.

A light passing through each corresponding element of the phase shift mask 33 has a different phase according to its region. FIG. 6 illustrates a magnified area of the dotted region of the shift mask 33, in FIG. 5 the light passed consecutively through only the substrate 21 has a phase $\phi 1$ and the light passed through the substrate 21 and the phase transition layer 25 has a phase $\phi 2$. Meanwhile, since the light shielding layer 24, as shown in FIG. 7, has a light transmitting ratio of 0 (zero) with respect to light having a short wavelength (shorter than that of i-line of an infrared ray having a wavelength of 365 mm) the light having a wavelength shorter than that of the i-line is effectively shielded. The difference between the phases $\phi 1$ and $\phi 2$ can be obtained by the following expression:

$$\phi 1 - \phi 2 = ]/(2n-1) = 180°,$$

where ] is the wavelength of the light, and n is a refractive index of the phase transition layer 25. Therefore, as shown in FIG. 8, the light having the phase $\phi 2$ has the same value but of a negative amplitude.

Figure 9A:
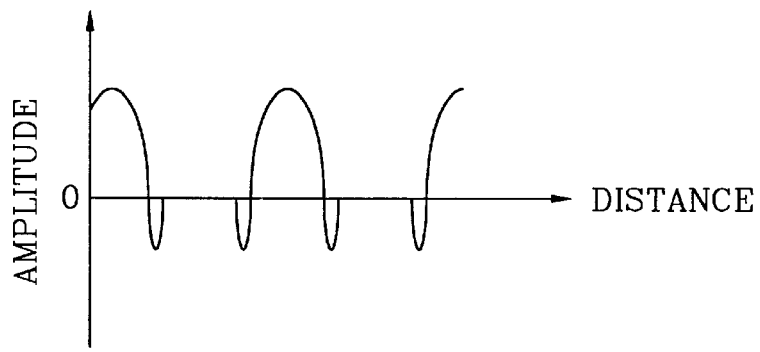
FIGS. 9A and 9B are graphs of a relationship between the amplitude and the intensiy of a light passed through an attenuating lens of FIG. 5.
Figure 9B:
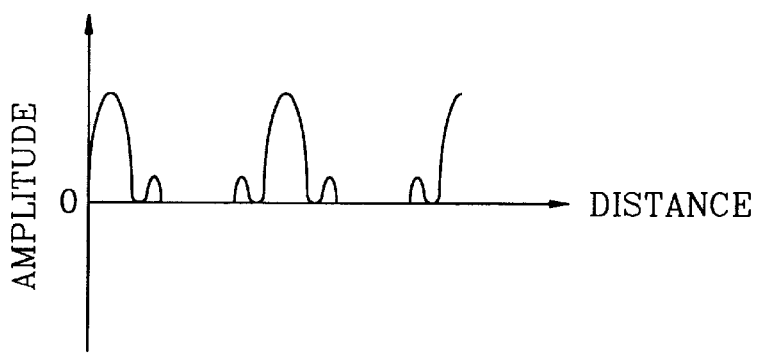

In the situation where a light passing through the attenuating lens 34 is exposed onto the photosensitive film, as shown in FIG. 9A, light having the phase $\phi 1$ has the positive amplitude, which approaches 0 (zero) as it comes to the edge of the phase transition layer 25. Meanwhile, light having the phase $\phi 2$ has a negative amplitude, which approaches 0 (zero) as it comes to the edge of the phase transition layer 25.

As described above, the phase shift mask according to the present invention forms a pattern of a light shielding layer of an inorganic photosensitive layer, on which silver (Ag) is doped, on a substrate of a phase shift mask, and forms a pattern of a light transmitting inorganic photosensitive film having a larger pattern than the pattern of the light shielding layer, so that the variation caused by heat between the phase shift mask substrate and the light shielding layer can be advantageously prevented. In addition, in the present invention, surface damage of the mask substrate can be prevented by selectively etching the light shielding film of chrome because a pattern of a light shielding film of chrome is not formed on a mask substrate. Further, in the present invention, silver (Ag) is doped on the region of the inorganic photosensitive film which is to be used as a light shielding layer, and the etching selection ratio between the region of an Ag-doped inorganic photosensitive film and the region of an inorganic photosensitive on which Ag was not doped is increased, so that a better vertical sidewall can be formed. Moreover, the present invention effectively shields a light having a wavelength shorter than i-line of an infrared ray by doping the Ag region of an inorganic photosensitive film that is used as a light shielding layer.

It will be apparent to those skilled in the art that various modifications and variations can be made in the phase shift masks and the fabricating methods thereof of the present invention without departing from the spirit or scope of the invention. Thus, it is intended that the present invention cover the modifications and variations of this invention provided they come within the scope of the appended claims and their equivalents.

What is claimed is:

1. A phase shift mask fabricating method comprising the steps of:

forming an inorganic photosensitive film on a light transmitting substrate;

forming a dopant containing layer on the inorganic photosensitive film;

selectively exposing the dopant containing layer to a light source to selectively dope and to convert a portion of the inorganic photosensitive film where exposed to the light source to a light shielding layer;

forming a phase transition layer on the light shielding layer, the phase transition layer having a width larger than the light shielding layer; and removing the inorganic photosensitive film except where selectively doped.

2. The method of claim 1, wherein the inorganic photosensitive film comprises a Ge—Se group inorganic photosensitive film.

3. The method of claim 1, wherein the inorganic photosensitive film is selectively doped with silver.

4. The method of claim 1, wherein the dopant in the dopant containing layer includes silver.

5. The method of claim 4, wherein the silver-containing layer includes AgCl.

6. The method of claim 4, wherein the silver-containing layer includes $AgNO_3$.

7. The method of claim 4, wherein the step of removing the inorganic photosensitive film includes the step of:

removing the silver-containing layer except where selectively exposed to light.

8. The method of claim 7, wherein the phase transition layer has a thickness corresponding to a phase shift of light transmitted therethrought.

9. The method of claim 4, wherein the silver-containing layer is selectively removed by a liquid containing HCl—$HNO_3$—$H_2O$.

10. The method of claim 1, wherein the step of forming a phase transition layer on the inorganic photosensitive film includes the steps of:

selectively exposing the phase transition layer to light; and selectively removing the phase transition layer except where exposed to the light.

11. The method of claim 1, wherein the phase transition layer and the inorganic photosensitive film are selectively removed by an alkali liquid.

12. The mask of claim 1, wherein the phase transition layer comprises an organic poly-methyl-methacrylate photosensitive film.

13. The method of claim 1, wherein the step of forming the inorganic photosensitive film includes one of Plasma Enhanced Chemical Vapor Deposition (PECVD) and sputtering.

14. The method of claim 1, wherein the step of forming a dopant containing layer includes dipping the substrate including the inorganic photosensitive film into a liquid containing the dopant.

15. The method of claim 1, wherein the light source includes one of electronic beam, infrared, or X-ray.

* * * * *